US009805963B2

(12) United States Patent
Long et al.

(10) Patent No.: US 9,805,963 B2
(45) Date of Patent: Oct. 31, 2017

(54) ELECTROSTATIC CHUCK WITH THERMAL CHOKE

(71) Applicant: Lam Research Corporation, Fremont, CA (US)

(72) Inventors: Maolin Long, Santa Clara, CA (US); Alex Paterson, San Jose, CA (US); Ying Wu, Dublin, CA (US); Quan Chau, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 91 days.

(21) Appl. No.: 14/875,473

(22) Filed: Oct. 5, 2015

(65) Prior Publication Data

US 2017/0098566 A1 Apr. 6, 2017

(51) Int. Cl.
*H01L 21/683* (2006.01)
*H01T 23/00* (2006.01)

(52) U.S. Cl.
CPC ................................ *H01L 21/6833* (2013.01)

(58) Field of Classification Search
CPC ............................ H02N 13/00; H01L 21/6833
USPC .......................................................... 361/234
See application file for complete search history.

(56) References Cited

U.S. PATENT DOCUMENTS 5,841,624 A 11/1998 Xu et al.
6,081,414 A 6/2000 Flanigan et al.
6,219,219 B1 4/2001 Hausmann et al.
6,242,360 B1 * 6/2001 Fischer ............. H01J 37/32082 156/345.44
6,291,777 B1 9/2001 Burkhart et al.
6,669,783 B2 12/2003 Sexton et al.
6,853,533 B2 2/2005 Parkhe
7,907,384 B2 3/2011 Brown et al.
8,390,980 B2 3/2013 Sansoni et al.
9,337,067 B2 5/2016 Roy et al.
(Continued)

FOREIGN PATENT DOCUMENTS

TW 386267 4/2000
TW 387094 4/2000
(Continued)

OTHER PUBLICATIONS

U.S. Office Action, dated Aug. 20, 2015, issued in U.S. Appl. No. 13/467,861.
(Continued)

*Primary Examiner* — Thienvu Tran
*Assistant Examiner* — Lucy Thomas
(74) *Attorney, Agent, or Firm* — Weaver Austin Villeneuve & Sampson LLP

(57) ABSTRACT

Apparatuses, systems, and techniques for providing enhanced electrostatic chucks are provided. Such apparatuses, systems, and techniques may include, for example, a common RF and DC electrode in an electrostatic chuck, connection, at a location external to a semiconductor processing chamber, of a high-voltage DC power source and a high-voltage RF power source to a common conductive pathway leading to an electrostatic chuck in the interior of the semiconductor processing chamber, a very thin dielectric layer located on an upper surface of an electrostatic chuck, and/or an axial thermal choke that may be used to control heat flow within an electrostatic chuck.

18 Claims, 10 Drawing Sheets

(56) References Cited

U.S. PATENT DOCUMENTS

2002/0129475 A1 9/2002 Tsai et al.
2003/0047283 A1* 3/2003 Parkhe ................ C23C 16/4581 156/345.51
2006/0237138 A1 10/2006 Qin
2007/0020937 A1 1/2007 Chen et al.
2008/0138535 A1 6/2008 Hwang
2008/0218931 A1* 9/2008 Hsu ..................... H01L 21/6831 361/212
2010/0039747 A1 2/2010 Sansoni et al.
2010/0116788 A1* 5/2010 Singh .................. C23C 16/4586 216/66
2011/0272899 A1 11/2011 Shimazu
2012/0285658 A1 11/2012 Roy et al.
2014/0042716 A1* 2/2014 Miura ............... H01L 21/67103 279/128
2014/0177123 A1 6/2014 Thach et al.
2015/0129165 A1 5/2015 Parkhe et al.

FOREIGN PATENT DOCUMENTS

WO WO 2007/131057 11/2007
WO WO 2012/158528 11/2012

OTHER PUBLICATIONS

PCT International Search Report and Written Opinion dated Jan. 31, 2013 issued in PCT/US2012/037543.
PCT International Report on Patentability and Written Opinion dated Nov. 28, 2013 issued in PCT/US2012/037543.
U.S. Notice of Allowance, dated Jan. 12, 2016, issued in U.S. Appl. No. 13/467,861.
Taiwan Office Action and Search Report dated Dec. 16, 2015 issued in TW 101116972.

* cited by examiner

ELECTROSTATIC CHUCK WITH THERMAL CHOKE

BACKGROUND

During semiconductor processing operations, a semiconductor wafer is typically supported on a pedestal within a processing chamber. The wafer may be held in place with respect to the pedestal using a "chuck," which is a device that augments the force of gravity with some other type of clamping force that increases the friction load between the wafer and the pedestal/chuck in order to prevent relative movement between the wafer and the pedestal/chuck. One type of chuck that is used in such operations is an "electrostatic chuck," or ESC. Discussed herein are improvements relating to ESC design.

SUMMARY

Figure 1:
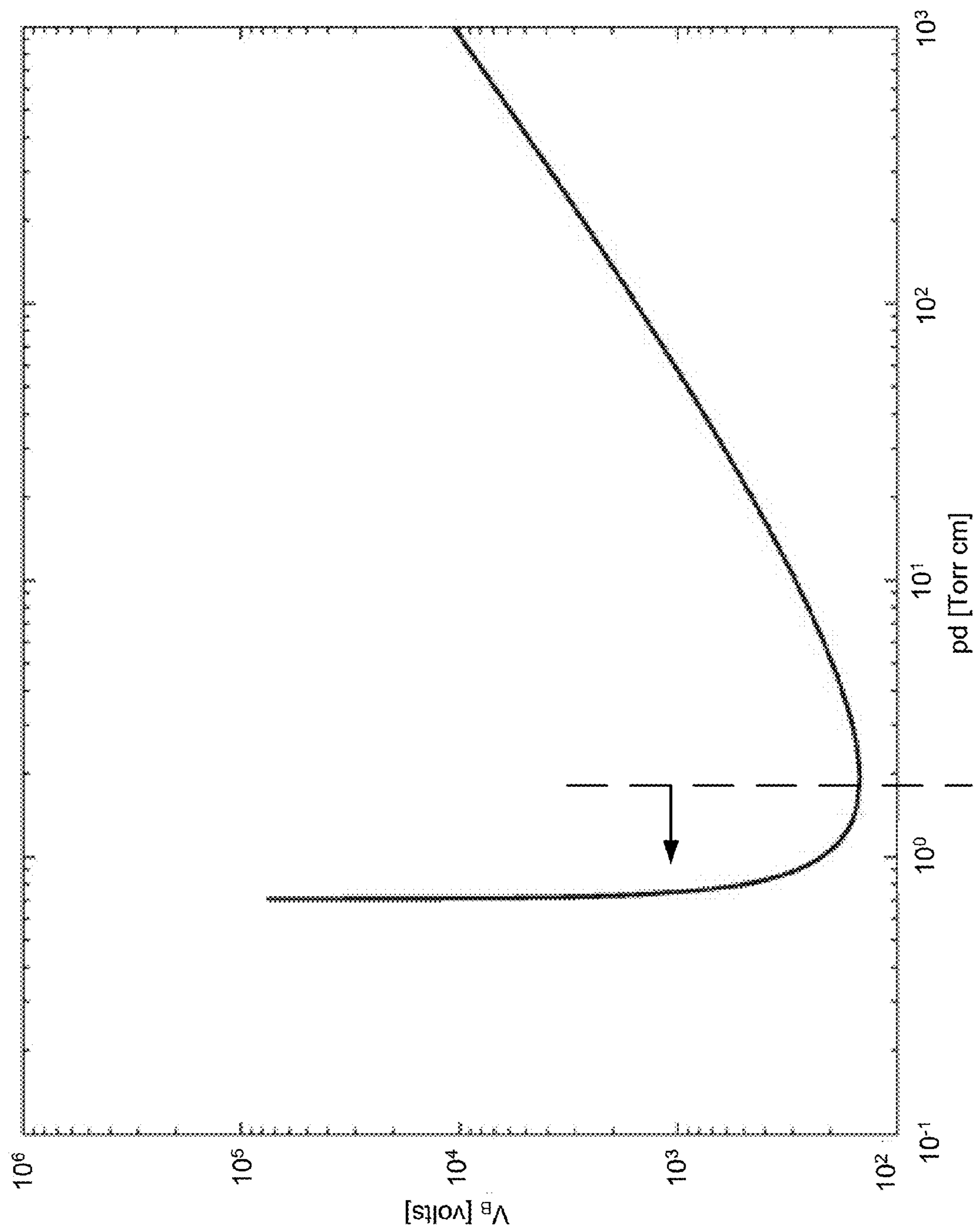
FIG. 1 depicts a Paschen curve for helium gas.

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some embodiments, an electrostatic chuck for a semiconductor processing tool may be provided. The electrostatic chuck may include a baseplate, a thermal choke that may include a thermal choke layer including a plurality of first cavities. The first cavities may be arranged across the thermal choke layer, may not contain liquid during normal operation of the electrostatic chuck, and may be filled with gas or filled with solid material having a lower thermal conductivity than a material of the thermal choke layer. The electrostatic chuck may also include a heater, a top plate, and a ceramic layer. The baseplate may be adjacent to the thermal choke, the thermal choke may be interposed between the baseplate and the heater, the heater may be interposed between the thermal choke and the top plate, the top plate may be interposed between the heater and the ceramic layer, the ceramic layer may be adjacent to the top plate, the top plate and the baseplate may both be made of metal, and the top plate and the baseplate may be in electrically conductive contact with each other.

In some further embodiments, the first cavities may extend through the thermal choke layer in a direction substantially parallel to an axis perpendicular to the ceramic layer.

In some further embodiments, the first cavities may be spread across substantially the whole thermal choke layer.

In some such embodiments, the material of the thermal choke layer may be metal.

In some further such embodiments, the material of the thermal choke layer may be aluminum.

In some further embodiments, the first cavities may be spaced apart from each other by 2 millimeters or less.

In some further such embodiments, one or more of the first cavities may have a diameter of 0.5 centimeters or less.

In some further embodiments, the first cavities may be filled with solid material such as a ceramic material, Teflon, a silicone, or a polyimide.

In some embodiments, the electrostatic chuck may further include a plurality of second cavities that may be arranged across the thermal choke layer, that may not contain liquid during normal operation of the electrostatic chuck, that may be filled with gas or filled with solid material having a lower thermal conductivity than a material of the thermal choke layer, that may be differently sized than the first cavities, and that may not intersect with the first cavities.

In some embodiments, a system may be provided. The system may include a semiconductor processing chamber; an electrostatic chuck that may be located inside the semiconductor processing chamber and that may include a baseplate, a top plate, and a ceramic layer; a common, electrically conductive path that may extend from outside the semiconductor processing chamber to a location in electrically conductive contact with the electrostatic chuck and inside the semiconductor processing chamber; a high-voltage direct current (DC) supply configured to provide an electrostatic clamping voltage; and a high-voltage radio frequency (RF) generator configured to provide RF energy. The top plate may be interposed between the baseplate and the ceramic layer, the ceramic layer may be adjacent to the top plate, the top plate and the baseplate may both be made of metal, the top plate and the baseplate may be in electrically conductive contact with each other, and the high-voltage DC supply and the high-voltage RF generator may both be electrically connected to the common, electrically conductive path at one or more locations outside of the semiconductor processing chamber.

In one such embodiment, the system may further include a capacitor located on the outside of the semiconductor processing chamber. The capacitor may be electrically interposed between the high-voltage RF generator and the high-voltage DC supply, and may not be electrically interposed between the high-voltage DC supply and the electrostatic chuck.

In further such embodiments, the capacitor may have a capacitance of 21 nanofarads or less.

In some embodiments, the system may further include a support column and a transverse support arm. The support column may be interposed between the baseplate and the transverse support arm, the transverse support arm may span between the support column and a location external to the semiconductor processing chamber, the support column and the transverse support arm may both be made of metal, the support column and the transverse support column may be electrically connected, and the support column and the transverse support arm may serve as at least part of the common, electrically conductive path.

In one such embodiment, the electrostatic chuck may further include a heater and a thermal choke with a thermal choke layer that may include a plurality of first cavities that may be arranged across the thermal choke layer, that may not contain liquid during normal operation of the electrostatic chuck, and that may be filled with gas or filled with solid material having a lower thermal conductivity than a material of the thermal choke layer. The baseplate may be adjacent to the thermal choke, the thermal choke may be interposed between the baseplate and the heater, and the heater may be interposed between the thermal choke and the top plate.

In further such embodiments, a portion of the thermal choke layer may be metal, and the thermal choke may be electrically connected to both the baseplate and the top plate via this portion.

In further such embodiments, the system may further include a heater power cable, a support column and a transverse support arm. The support column may be interposed between the baseplate and the transverse support arm, the transverse support arm may span between the support column and a location external to the semiconductor processing chamber, the support column and the transverse support arm may both be made of metal, the support column and the transverse support column may be electrically connected, the support column and the transverse support arm may serve as at least part of the common, electrically conductive path, the support column and transverse support arm may both be hollow, and the support column and transverse support arm may be connected such that the heater power cable is routed from a location external to the semiconductor processing chamber to the heater through both the support column and the transverse support arm.

In one embodiment, an electrostatic chuck for a semiconductor processing tool may be provided. The electrostatic chuck may include a baseplate, a top plate, and a ceramic layer. The top plate may be interposed between the baseplate and the ceramic layer, the ceramic layer may be adjacent to the top plate, the top plate and the baseplate may both be made of metal, the top plate and the baseplate may be in electrically conductive contact with each other, and the ceramic layer may have a thickness less than 100 microns.

In some embodiments, the ceramic layer may have a thickness of 3 mil or less.

In some embodiments, the ceramic layer may be a ceramic coating or a ceramic sheet laminated onto the top plate.

In some such embodiments, the electrostatic chuck may be installed in a semiconductor processing chamber to form a system. The semiconductor processing chamber may have a common, electrically conductive path that may extend from outside the semiconductor processing chamber to a location in electrically conductive contact with the electrostatic chuck and inside the semiconductor processing chamber, a high-voltage direct current (DC) supply configured to provide an electrostatic clamping voltage, and a high-voltage radio frequency (RF) generator configured to provide RF energy. The electrostatic chuck may be located inside the semiconductor processing chamber and the high-voltage DC supply and the high-voltage RF generator may both be electrically connected to the common, electrically conductive path at one or more locations outside of the semiconductor processing chamber.

In further such embodiments, the system may further include a capacitor located on the outside of the semiconductor processing chamber. The capacitor may be electrically interposed between the high-voltage RF generator and the high-voltage DC supply and may not be electrically interposed between the high-voltage DC supply and the electrostatic chuck.

In further such embodiments, the electrostatic chuck may further include a heater and a thermal choke having a thermal choke layer including a plurality of first cavities that may be arranged across the thermal choke layer, that may not contain liquid during normal operation of the electrostatic chuck and may be cavities filled with gas or cavities filled with solid material having a lower thermal conductivity than a material of the thermal choke layer. The baseplate may be adjacent to the thermal choke, the thermal choke may be interposed between the baseplate and the heater, and the heater may be interposed between the thermal choke and the top plate.

These and other implementations are described in further detail with reference to the Figures and the detailed description below.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the above implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description above because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

In some types of semiconductor processing, a wafer or substrate is processed within a processing chamber that may include a pedestal or support structure on which the wafer may be placed during such processing. It should be understood that the terms “wafer,” “substrate,” or “semiconductor substrate” may be used interchangeably herein. During some semiconductor processes, it may be desirable to keep the wafer in place and prevent it from moving at certain times, such as during active semiconductor processes which may include atomic layer deposition, atomic layer etching, chemical vapor deposition, plasma-enhanced chemical vapor deposition, and so forth.

A wafer may be secured in place within a semiconductor processing chamber by an electrostatic chuck (ESC). Some ESCs hold a wafer, which may be electrostatically charged as a result of processing operations, in place by applying a single direct current (“DC”) voltage to one or more clamping electrodes within the ESC such that the clamping electrode(s) and the wafer act as a capacitive circuit; the capacitive circuit is completed by the existence of a plasma within the chamber, so this design is limited to use in processing chambers where plasma environments exist during wafer processing. The clamping electrode(s) are typically thin, planar structures that are parallel to the overall plane of the wafer, and often extend across a region commensurate with the wafer size. The electrostatic force that arises due to the capacitive effect provides the clamping force. Such a configuration may be called “monopolar.” ESCs also may be used in chambers that do not produce plasma environments during processing. In such implementations, the plasma cannot be relied upon to complete the capacitive circuit and the ESC electrodes may instead include one or more cathodes and one or more anodes. The anodes and cathodes may occupy different regions of the ESC that face towards the wafer, e.g., an anode and cathode that occupy opposing semicircular regions under the wafer or an anode or a cathode arranged as a center circular electrode and a concentric outer electrode under the wafer acting as an anode. The anode and the cathode in such ESCs are electrically isolated from one another within the ESC, but when a wafer is placed on the ESC, the wafer completes two capacitive circuits—one where the wafer is the anode to the ESC cathode, and one where the wafer is the cathode to the ESC anode. ESCs have a dielectric layer or other insulator interposed between the clamping electrode(s) and the wafer; this dielectric or insulating layer serves to prevent a short circuit between the clamping electrode(s) and the other half of the capacitive circuit(s), i.e., the wafer, and defines the gap that governs the capacitance characteristics of the capacitive circuit formed by the ESC and the wafer. It is common to embed the electrodes within the dielectric or insulating material to protect the electrodes from exposure to the processing environment.

Other common features of ESCs include, depending on the particular needs of a semiconductor process, gas distribution holes and lift pin holes. The gas distribution holes may be used to flow thermally conductive, inert gas, such as helium, into the gap between the wafer and the ESC during processing. Since the wafer is clamped to the ESC by an electrostatic force, the surfaces of ESCs are frequently not completely flat since it may be desirable to reduce the amount of actual wafer-to-ESC contact. For example, the top surface of the ESC may have one or more thin, concentric raised rings and one or more thin raised radial spokes that actually contact the wafer, but the interstices between those raised rings and spokes may not contact the wafer. During processing in vacuum or near-vacuum environments, this may result in a concentration of heat flow through the regions of the wafer that are in actual contact with the ESC, which may cause non-uniformities in the wafer. To prevent this, the thermally conductive, inert gas may be flowed into these interstices to provide a distributed thermally conductive path that reduces the heat flow concentration through the physical contact areas. Even in flat-top ESCs that do not have raised/recessed areas by design, at a microscopic level, the physical contact between the wafer and the ESC may be intermittent, so there may also be a heat transfer benefit to introducing a thermally conductive gas between the wafer and the ESC even in these cases. The thermally conductive gas may also serve to provide an additional layer of protection against process gases—if the thermally conductive gas is flowed into the gap between the wafer and the ESC during processing, it will flow towards the wafer edge in order to escape, which prevents process gases from reaching the underside of the wafer and the portion of the ESC underneath the wafer, which protects these regions from undesired etch or deposition, as the case may be. Lift pin holes may be provided to allow lift pins to extend through the ESC and lift the wafer off of the ESC. The ESC lift pins may be configured to fully retract into the ESC lift pin holes such that in one position, the ESC lift pins do not extend past the ESC. These lift pins and their corresponding holes, among other things, allow a robot end effector or other mechanical device to place and/or remove a wafer from the ESC without contacting and/or interfering with the ESC.

The present inventors have identified a number of issues with existing ESC designs, several of which are discussed below, and have identified various improvements to existing ESC designs that may offer enhanced performance in at least these respects. It is to be understood that these improvements may be implemented in isolation from the other improvements, or in combination with one or more other of the improvements.

In many existing ESC designs, the clamping electrode(s) are embedded within a dielectric plate that is then bonded to a metal baseplate of the ESC (sometimes with other layers, such as a resistive heater layer, in between); the baseplate frequently serves both as an overall structural framework for the ESC as well as a radio-frequency (RF) electrode that is used for generating a plasma environment within the processing chamber. In such designs, the clamping electrode(s) are completely encased in the dielectric plate except for a portion or portions of the clamping electrode(s) that are left exposed on the underside of the dielectric plate for electrical contact purposes; the dielectric plate in such designs also conductively isolates the clamping electrode(s) from the RF electrode. After the dielectric plate is bonded or otherwise affixed to the baseplate (or bonded/affixed to other layers on top of the baseplate), one or more spring-loaded electrical contact pins may be installed in the baseplate at a location or locations that correspond to the exposed portion or portions on the underside of the clamping electrode(s); the spring-loaded electrical contact pin(s) may then be compressed into electrically conductive contact with the clamping electrode(s) at the exposed portion or portions. These spring-loaded contact pins are electrically isolated from the baseplate and are connected to a high-voltage DC power cable; the RF electrode, in turn, is supplied RF power from a bias RF generator via a separate electrical connection. Due to the very high voltages involved, e.g., multiple kilovolts, such spring-loaded electrical contacts must often have a high spring force to ensure that good electrical contact occurs in order to avoid potential arcing that may damage the clamping electrode. Correspondingly, the dielectric plate or layer in such designs must be thick enough to withstand the compressive loads exerted on it by such spring-loaded electrical contacts. This may require, for example, a dielectric layer in which at least one or two hundredths of dielectric material are between the wafer and the clamping electrode(s).

One issue that may arise while using an ESC is high-voltage breakdown, "light up," or arcing in the areas surrounding the gas distribution holes and the lift pin holes, as these are areas in which the embedded electrode(s) have a natural end point (for example, the electrode(s) may have circular pass-throughs surrounding such features, and the inner perimeter of such pass-throughs may act as a natural arc initiation site). When two structures that may serve as electrodes, such as the embedded clamping electrode and the wafer, are separated by a gap, arcing or high-voltage breakdown may occur under certain circumstances. These circumstances are typically dependent on the voltage difference between the electrodes, the composition of the gases within the gap, the pressure of those gases, and the size of the gap. The interplay between these factors is characterized by Paschen's law, which provides the high-voltage breakdown voltage as a function of pressure, gap distance, and two gas-dependent parameters. The voltage that is necessary to start a light-up or an arc is called the "breakdown voltage" and is a function of the gas that fills the gap between the two electrodes, the pressure of that gas, and the distance between the potential endpoints of the electrical arc. This relationship is dictated by Paschen's Law, which states that $$V_B = \frac{apd}{\ln(pd) + b}$$

where "$V_B$" is the breakdown voltage, "p" is the pressure, "d" is the distance, and "a" and "b" are empirically derived constants associated with the gas involved.

FIG. 1 depicts a Paschen curve for helium gas. The logarithmic vertical axis represents the breakdown voltage in volts (i.e., the voltage necessary to create an arc) while the horizontal logarithmic axis represents the pressure multiplied by the distance in Torr-cm. As can be seen in FIG. 1, the lowest, or minimum, breakdown voltage of approximately ~150V is at the lowest point of the Paschen curve, which occurs at approximately 4 Torr-cm (additional information regarding Paschen's Law may be found in the book titled "High Voltage Engineering" by J. Rohan Lucas, © 2001 by J R Lucas, including, but not limited to Chapter 1, which is hereby incorporated by reference herein). This characteristic creates two regions in which semiconductor processing can occur before the lowest breakdown voltage is reached—the "left side" of the lowest point of the curve and the "right side" of the lowest point of the curve. The dashed vertical line in FIG. 1 approximates the dividing line between these two sides.

In some ESCs, the high-voltage breakdown across the ceramic puck is caused by the combination of the RF voltage and the high-voltage DC, although most of the voltage that causes high-voltage breakdown in many ESC designs is attributable to high voltage supplied by the RF generator. The breakdown of RF power follows a similar Paschen curve as the DC voltage shown in FIG. 1.

In many typical ESC designs, such as the dielectric plate with embedded electrode discussed above, the relevant distances within the ESC, e.g., between the clamping electrode(s) and the wafer, are constrained by various other factors, such as manufacturability of the dielectric plate and various structural considerations, such as the need to be able to withstand the spring force of a spring-loaded, high-voltage electrical contact, to certain minimum thicknesses that, in conjunction with the gas pressures typically experienced, may result in a pressure-distance value that causes the high-voltage breakdown voltage to remain near the minimum point of the depicted curve for many potential process environments. For example, when the distance between the wafer and the clamping electrode(s) is approximately 0.013 in, the minimum voltage breakdown in helium occurs at a pressure of approximately 60 Torr. In such situations, this limits the pressures and voltages at which semiconductor operations can be performed without the risk of a high-voltage arc or light-up. In order to reduce the potential for such high-voltage breakdown, designs such as the dielectric plate with embedded clamping electrode are typically designed with an increased overall thickness that forces the ESC to operate under conditions associated with the "right side" of the Paschen curve. The increased thickness of the dielectric plate increases the distance between the wafer and the RF electrode located below the dielectric plate, which drives the ESC to operate on the right side of the Paschen curve.

As the dielectric plate or layer thickness in such designs is increased, however, the RF power efficiency of the bias RF system is decreased due to the increasing thickness of the dielectric material that exists between the RF electrode (in the form of the baseplate) and the wafer/processing area. This, in turn, may require higher RF power throughput, which impacts power consumption and may result in a higher potential for high-voltage breakdown (due to the use of a higher RF voltage), which may negatively affect semiconductor processing.

In many semiconductor processing operations, the ESC also may include thermal management components for heating and/or cooling the wafer. In some semiconductor processes, the wafer, while on an ESC, may be heated to temperatures ranging from approximately 30° C. to 150° C. or higher using heating elements embedded within the ESC in order to meet certain processing requirements.

In some ESCs, the heating elements may be small and/or low power which may require that the heat is transferred and directed as effectively as possible from the heaters to the wafer, and not directed at or lost to other elements of the ESC or the surrounding environment. Additionally, some other elements of the ESC and/or elements of the semiconductor processing chamber may be adversely affected by heat from the heaters. Thus, the present inventors determined that controlling the directionality of the thermal conductivity of the layers around the heater may enhance ESC functionality. For instance, if there are thermally conductive layers in thermal contact with the heating elements that do not direct the heat towards the wafer, then such layers may decrease the effectiveness and/or tunability of the heaters and ESC. As another example, an ESC baseplate containing internal cooling channels that is placed directly adjacent to a heater may drain too much heat from the heater, thereby reducing the heat delivered by the heater to the top plate, ceramic layer, and wafer. On the other hand, if such example ESC contained a thermal choke in between the baseplate and heater, then the thermal choke may control the rate at which heat is drained from the heater into the baseplate and may cause that heat to instead be directed towards the layers above the heater. Furthermore, in some ESCs as discussed above, the placement of the heating elements within the ESC and/or processing chamber may increase the light-up risk by, among other things, requiring an increased thickness of the dielectric layer which in-turn may lower the minimum breakdown voltage for a given pressure, and/or creating additional areas in which light-up may occur.

Another issue that the present inventors identified was that the routing of cables within the pedestal and ESC may have a significant impact on ESC and semiconductor processing chamber performance. A pedestal having an ESC may have a number of different cables routed to it that conduct power or signals to and/or from the various electrical systems within the pedestal, including, for example, to the clamping electrode(s), the RF electrode(s), and the heater (if present), as well as potentially cabling for a temperature sensor or sensors and non-electrical conduits, such as coolant hoses or the like. Each of these cables or conduits is typically routed from devices, e.g., high-voltage DC power sources for ESC clamping, high-voltage RF power sources for plasma generation, heat exchanger systems for supplying coolant liquid, controllers that may provide control signals or receive sensor signals, etc., located external to the processing chamber, through whatever structure supports the pedestal and ESC, and to the underside of the pedestal, where such cables and conduits are then connected to various connection points on the underside of the pedestal within the interior of the processing chamber which may include an area below and at least partially surrounding the pedestal and ESC, sometimes referred to as a "bowl."

The present inventors determined that cable location and routing within the bowl may actually directly affect wafer-to-wafer uniformity for wafers processed in a given semiconductor processing chamber, as well as chamber-to-chamber variability—even though the ESC itself is interposed between these cables and the wafer and even though such cable routing is typically not apparent from within the chamber since it occurs either within the pedestal/ESC or underneath the pedestal/ESC, and is not visible when viewing a wafer from the top side of the ESC. Wafer-to-wafer uniformity is important, as it indicates how likely it is that a fixed set of process conditions used in a semiconductor processing chamber will lead to a desired result, i.e., a processed wafer with low feature loss. Chamber-to-chamber variability is also important, as it indicates how likely it is that process parameters developed for one semiconductor processing chamber will be effective when used in a similar semiconductor processing chamber The present inventors discovered that improvements to the routing and placement of some cables into and within the processing chamber and bowl around the pedestal directly affect the wafer-to-wafer variability of the processing chamber, as well as chamber-to-chamber variability, as measured by, among other things, wafer-to-wafer uniformity and differences between chamber-to-chamber resonant frequencies. The present inventors performed an experiment in which an existing semiconductor processing tool was modified to constrain the locations of various cables and conduits within the processing chamber and bowl. In the original semiconductor processing tool, two parallel, vertically stacked horizontal "tunnels" traveled from the outside of the processing chambers to the interior of the chamber. The bottom horizontal tunnel included an RF conductor that was connected to the bottom of a vertical column connected to the baseplate of the ESC; the other horizontal tunnel included separate cables for supplying heater power to a heater element and high-voltage DC power to the ESC clamping electrode(s). These cables were routed through the upper horizontal tunnel, but otherwise not constrained in place within the tunnel, i.e., they could, from one chamber to the next, vary slightly in terms of positioning within their respective tunnels. Moreover, these cables, once they exited the tunnel and traversed the bowl to the underside of the ESC/pedestal, did not necessarily follow the same paths from the tunnel exit to the underside of the ESC/pedestal from chamber to chamber.

In the modified semiconductor processing tool that was tested by the present inventors, the cabling within the tunnel was constrained by a plastic guide or guides that constrained the cables to specific locations within the tunnel; this resulted in a reduction in the chamber-to-chamber variation in the cable placement within the tunnels. The inventors also introduced cable routing clamps that further constrained the routing of the cables in between the tunnel exit and the connection point of each cable to the pedestal/ESC. This further reduced the variation in cable routing within the processing chamber/pedestal bowl from chamber to chamber.

During various stages of performing such modifications, the present inventors performed wafer processing operations and observed various beneficial effects. For example, the chamber-to-chamber $4^{th}$ order resonant frequency variability was reduced from 1.1 MHz to approximately 0.5 MHz for those processing operations after installing the tunnel cable guide and constraining the location of the cables in the upper tunnel. When the inventors then further constrained the cable locations between the tunnel exit and the pedestal/ESC, the chamber-to-chamber $4^{th}$ order resonant frequency variability was reduced to less than 0.1 MHz.

As a further example of how cable placement affects process variability, the present inventors found that in certain etch processes, securing a cable from a loose position to a fixed position from the RF tunnel to the ESC decreased the variability between processed wafers. In this case, the inventors secured a voltage control interface wire (hereinafter "VCI wire"; such wire travels from the outside of the processing chamber to inside the chamber and measures the RF voltage of the RF electrode of the ESC), to a single, fixed configuration within a processing chamber, which resulted in a decrease in the variability of processed wafers, as shown in FIG. 2.

Figure 2:
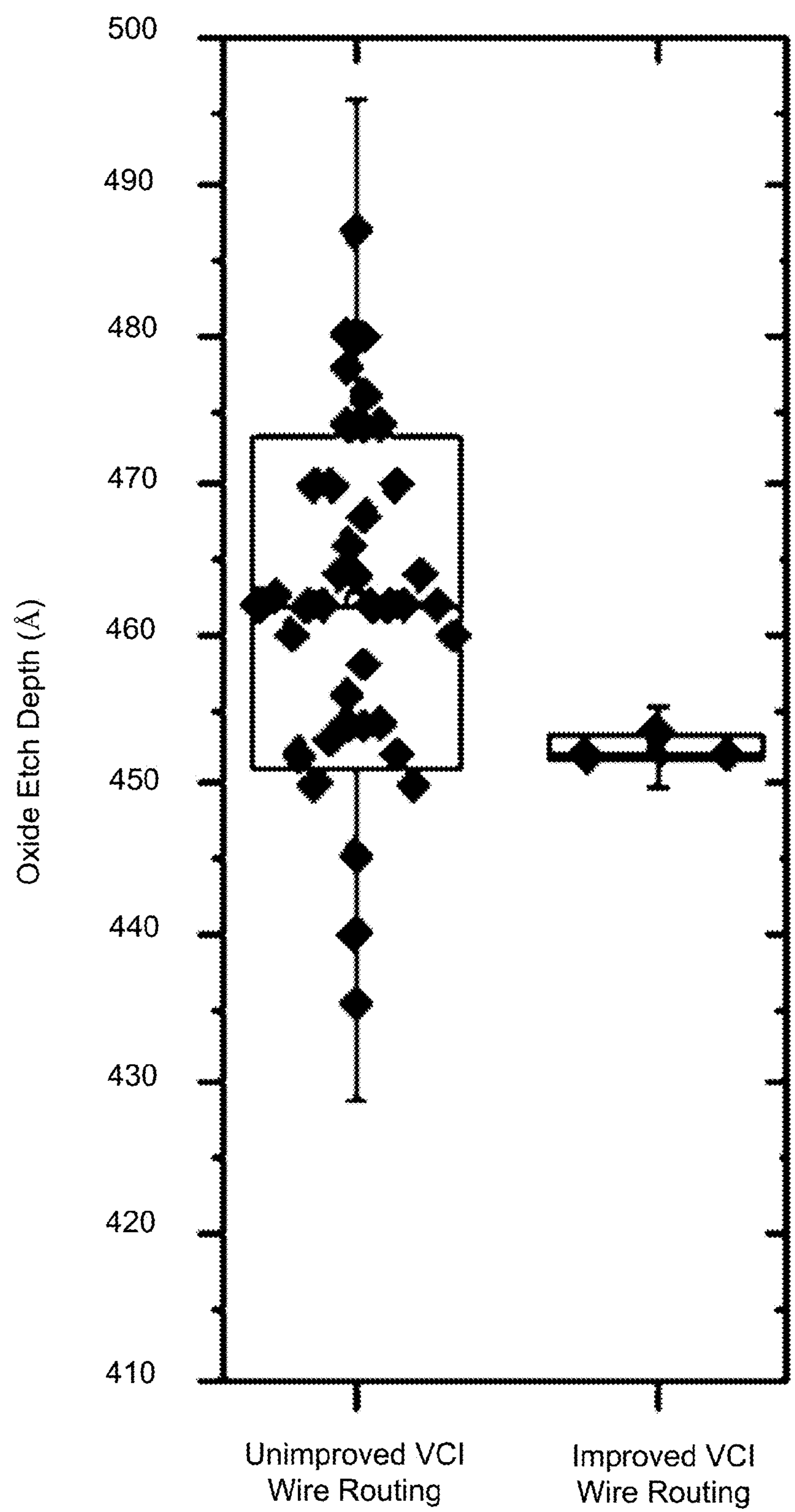
FIG. 2 depicts wafer-to-wafer variability before and after structurally securing the voltage control interface wire within the bowl.

FIG. 2 depicts wafer-to-wafer variability before and after securing the voltage control interface wire within the bowl. As can be seen in FIG. 2, the vertical axis is oxide etch depth in angstroms, which is the resulting etch depth following an etching process. The horizontal axis contains two data sets, with the left-side set, entitled "Unimproved VCI Wire outing," depicting wafer processing in a chamber with an unsecured VCI wire, with the right-side set, entitled "Improved VCI Wire Routing," depicting wafer processing in a chamber with a secured VCI wire as described above. As can be seen in FIG. 2, the wafers processed by the chamber with the unimproved VCI wire routing vary in etch depth from between approximately 435 Å to approximately 486 Å, or a range of about 50 Å. On the other hand, the right-side data shows that the etch depth variability is in a much smaller range of approximately 5 Å. Based on the foregoing test results, the inventors determined that cable placement and routing significantly affects wafer and chamber variability. Based on these observations, the present inventors further determined that while significant improvements in wafer and chamber variability could be made by more carefully managing cable placement so that cabling was placed in a more consistent manner from chamber to chamber and in a more constrained manner within a given chamber, an even more effective approach would be to remove one or more cables from within the tunnel and bowl entirely, in which case there would be no chamber-to-chamber variability associated with the removed cable or potential for the removed cable to move relative to the tunnel and bowl and thus no contribution from the removed cable to processing non-uniformity.

In response to at least some of the above issues identified by the present inventors, the present inventors conceived of several ways in which the design of an ESC could be changed in order to significantly improve performance and resulting uniformity of processed wafers. As part of this effort, the present inventors determined that an ESC implementing one or more of the design options discussed below may provide for enhanced semiconductor processing performance.

One such design option identified by the inventors is to utilize a common clamping electrode/RF electrode, i.e., clamping electrode functionality and RF electrode functionality may both be provided by the same conductive structure, e.g., by the baseplate/top plate (or equivalent structure). In such an implementation, both high-voltage RF power for plasma generation and high-voltage DC power for ESC clamping functionality may be provided to the ESC through a common conductive pathway, thus eliminating a separate DC power cable that is usually routed through a tunnel and/or support column to the pedestal/ESC. A further benefit of utilizing such a common RF/DC electrode is that the use of the DC clamping electrodes discussed earlier, e.g., dielectric plates with embedded clamping electrodes, may be avoided. Such dielectric plate/embedded clamping electrode components are costly to make, frequently fragile, and may introduce the various performance issues discussed earlier. Instead, the common DC/RF electrode (or baseplate) may simply have a thin dielectric or insulating material coating or layer applied to it on at least the top surface that supports the wafer during processing. This thin dielectric or insulating material may electrically isolate the common DC/RF electrode from the wafer and from the processing chamber environment. The present inventors further determined that by shifting away from designs in which the clamping electrode is embedded within the dielectric plate, it is also possible to implement a significant decrease of the dielectric layer thickness between the clamping electrode(s) and the wafer, thereby allowing ESC operation to occur on the far "left side" of the Paschen curve and allowing a wider range of operating conditions, including greater pressures, higher RF power, and lower frequencies, among other things, before reaching the minimum breakdown voltage. Additionally, by utilizing a thinner dielectric layer thickness between the clamping electrode and the wafer, a lower DC clamping voltage can be used than in other ESC designs. Heating elements for a tunable ESC may also be embedded within the ESC, not the dielectric layer, with a reduced danger of voltage light-up since the heating elements, in this case, would not be interposed between the RF electrode and the wafer.

Figure 3:
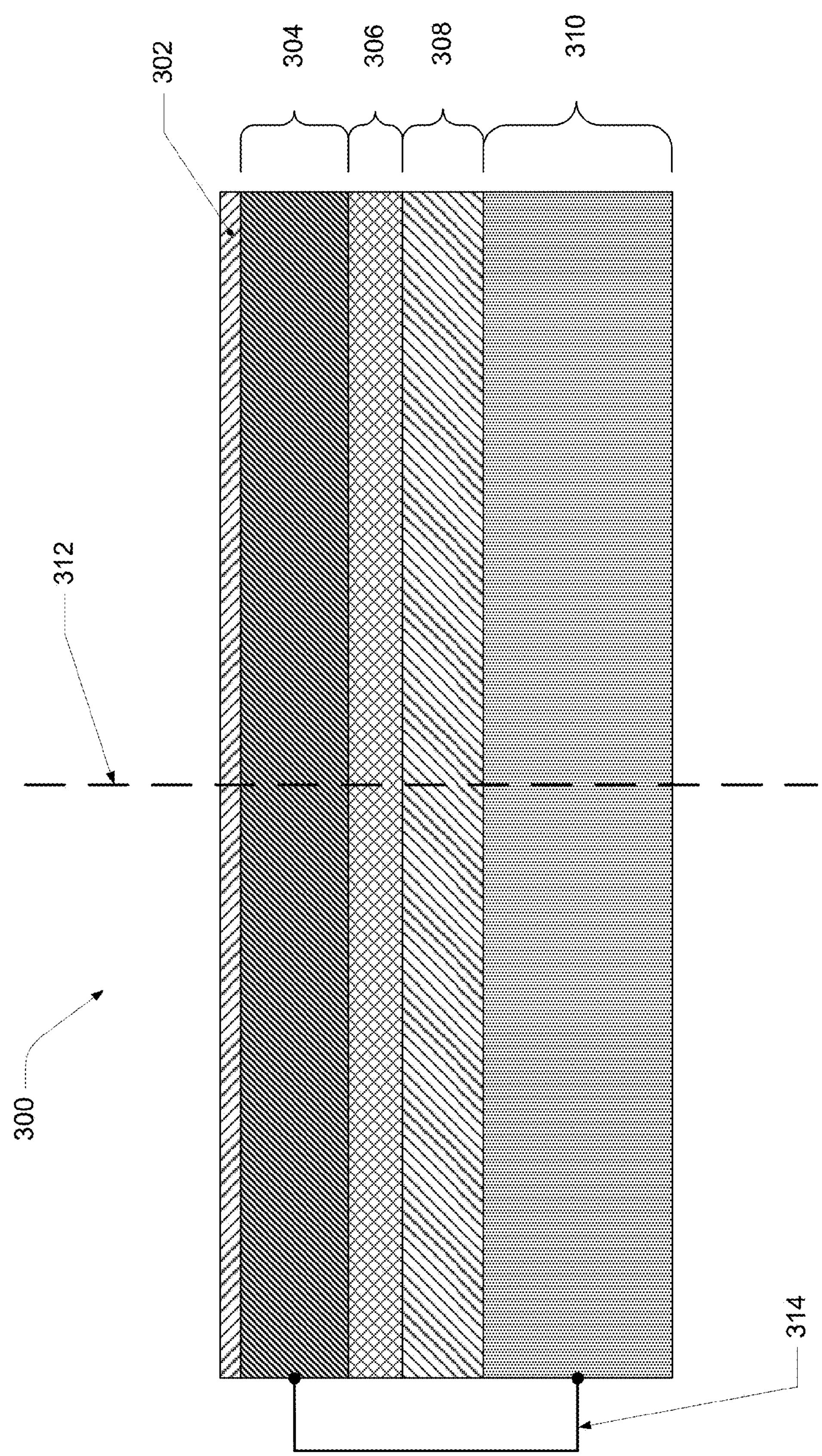
FIG. 3 depicts a sectional side view of an example electrostatic chuck in accordance with some of the concepts discussed herein.

FIG. 3 depicts a sectional side view of an example electrostatic chuck in accordance with some of the concepts discussed herein. This FIG. 3 is a general example configuration of an ESC; the ESC elements are representative and not to scale. As depicted, the ESC 300 includes multiple layers, beginning with a ceramic layer 302 at the "top" of this design and placed on a top plate 304, below which is a heater 306, below which is a thermal choke 308, with a baseplate 310 as the bottom layer. As can be seen, the top plate 304 is interposed between the ceramic layer 302 and the heater 306, the heater 306 is interposed between the top plate 304 and the thermal choke 308, and the thermal choke 308 is interposed between the heater 306 and the baseplate 310. The heater 306 may be made of a metal, which may be aluminum or an aluminum alloy, and it may include heating elements with high temperature insulation. For example, the heating elements may be routed within serpentine channels in an aluminum plate (or channels that are machined into the baseplate). It should be noted that these aforementioned ESC 300 layers are not an exhaustive listing of elements within the ESC 300; other layers may be included in the ESC 300 and interposed between one or more of the aforementioned layers of the ESC 300. Similarly, one or more of these layers may not be included within the ESC 300.

FIG. 3 also depicts a first axis 312 through the ESC 300 that is substantially perpendicular, e.g., within ±5° of perpendicular, to the ESC 300 layers, including at least the dielectric or ceramic layer 302.

A thermal choke is a structure that is designed to restrict heat flow and is typically engineered to provide a particular thermal resistance across the thermal choke structure. While every material or structure impedes heat flow to some degree, a thermal choke is an element that is designed to substantially restrict heat flow along a conduction path beyond the restriction on heat flow provided by an upstream element on the path, by approximately greater than a 2:1 ratio. The thermal choke 308 is designed to control thermal conductivity through the layers of the ESC 300 in a direction generally aligned with the first axis 312, e.g., vertically through the ESC 300 layers. In particular, the thermal choke 308 is designed to limit the amount of heat flow from the heater 306 towards the baseplate 310, thereby biasing the heat flow from the heater 306 to flow vertically "upwards" towards the top plate 304 and the ceramic layer 302.

The present design allows for many benefits over designs without such thermal chokes, including, but not limited to, greater and/or more efficient heating of a wafer on the ceramic layer 302 while at the same time using lower power in the heater 306. Moreover, the present design allows for more accurate temperature tunability of a wafer located on the ceramic layer 302, which improves wafer uniformity, as discussed above.

As discussed earlier, the ceramic layer 302 may be much thinner than is typically the case in most ESC designs. For example, the ceramic layer 302 may be thinner than 3 mils, including thinner than 1.5 mils. As discussed earlier, such a thin dielectric layer may cause the operating regime of the ESC 300 to remain to the far left of the dashed line depicted in FIG. 1.

ESC 300 also depicts an electrical connection 314 between the baseplate 310 and the top plate 304 such that these two layers are electrically connected. In some embodiments, the baseplate 310 and the top plate 304 may be made of metal, which may include, for instance, aluminum or an alloy thereof. It should be noted that such electrical connection 314 depicted in FIG. 3 is not an actual schematic of where and/or how the electrical connection is made between these two layers, but rather is a representation that the two layers are electrically connected. The electrical connection 314 causes the baseplate 310 and the top plate 304 to be at the same electrical potential. Thus, for example, if high-voltage RF power and high-voltage DC power are provided to the baseplate 310, the same RF and DC power will also be applied to the top plate 304. In some implementations, the top plate 304 and the baseplate 310 may form a single, contiguous structure, or at least a structure that is assembled from subcomponents and fused together, e.g., via brazing. This electrical connection as well as different electrical configurations of the ESC are discussed in further detail below.

Figure 4:
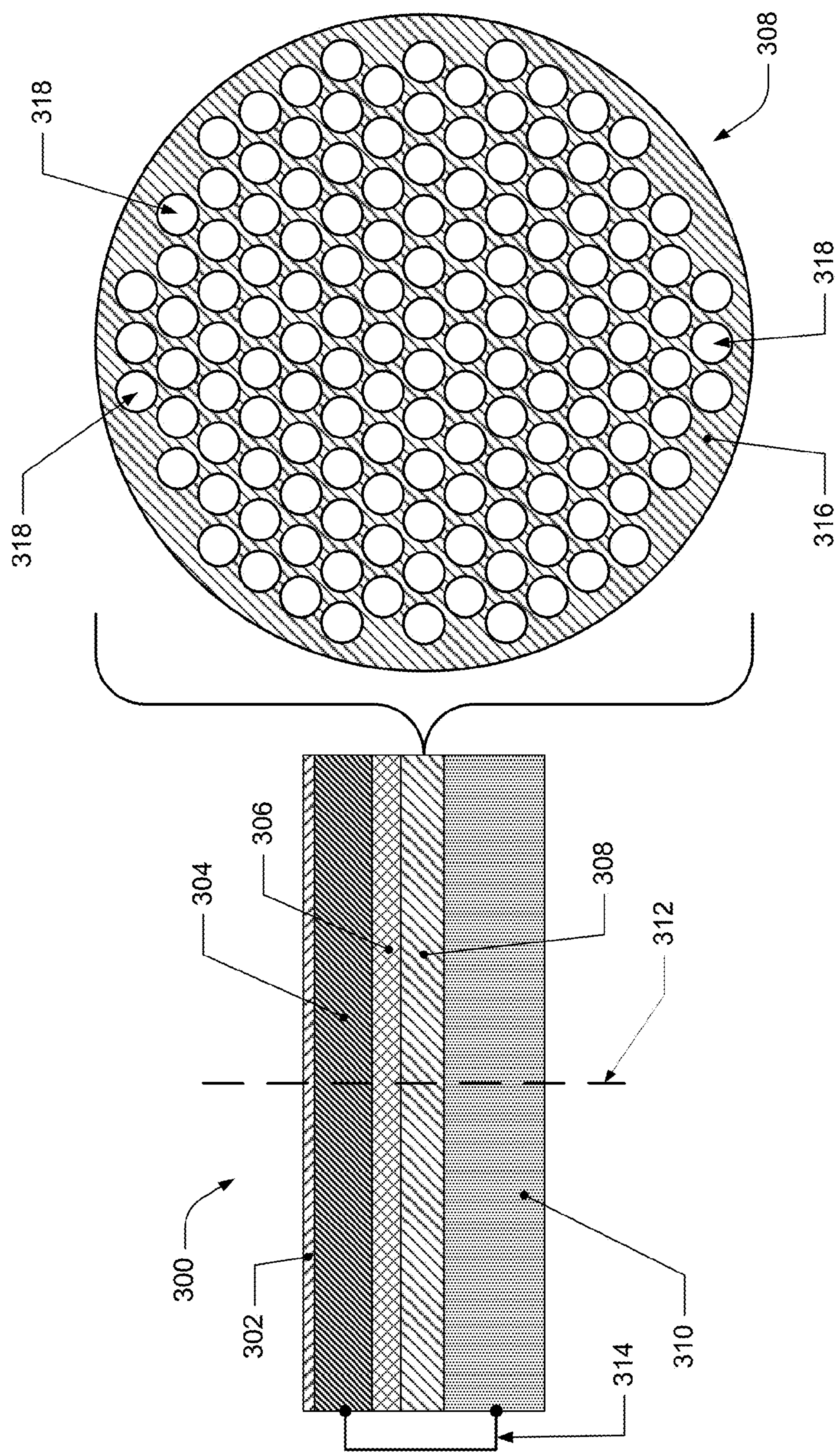
FIG. 4 depicts, on the left hand side of the Figure, a simplified sectional side view of the ESC in FIG. 3 and, of the right hand side of the Figure, a top view of the thermal choke.

Example embodiments of the thermal choke will now be discussed. FIG. 4 depicts, on the left hand side of the Figure, a simplified sectional side view of the ESC in FIG. 3 and, of the right hand side of the Figure, a top view of the thermal choke. As can be seen, ESC 300 is shown with the ceramic layer 302, the top plate 304, the heater 306, the thermal choke 308, and the baseplate 310 arranged like in FIG. 3. The thermal choke 308 section is viewed from a direction parallel to the first axis 312. As depicted in FIG. 4, the thermal choke 308 includes a thermal choke layer 316 that includes a plurality of first cavities 318. The first cavities 318 may be arranged across the thermal choke layer 316. The first cavities 318 may also be arranged substantially across the thermal choke layer 316 such that the majority of the volume of thermal choke layer 316 includes the first cavities 318. In some embodiments, the first cavities 318 may be arranged across 50% or more of the thermal choke layer. Generally speaking, the first cavities may be filled with a solid or gas having a lower thermal conductivity than the thermal conductivity of the rest of the thermal choke layer. In some implementations, the thermal conductivity of the material filling the cavities may be on the order of 2 to 5 times or more smaller in magnitude compared to the thermal conductivity of the material forming the rest of the thermal choke layer.

In some embodiments, each of the first cavities 318 may be fluidically isolated from one another within the thermal choke layer 316. In some embodiments, the first cavities 318 may be filled with a gas and such gas, e.g., argon, may have low thermal conductivity compared to the material, e.g., an aluminum alloy or stainless steel alloy, of the rest of the thermal choke layer 316. In some other embodiments, the first cavities 318 may be filled with a solid material with a low thermal conductivity, for instance, a ceramic material, Teflon, silicone, a polyimide, and/or Kapton. The first cavities 318 may be filled with gas and/or material in any number of combinations that suit the desired semiconductor process and/or thermal tuning of the ESC. For example, some first cavities 318 may be filled with a ceramic while other first cavities 318 may be filled with silicone. It is to be understood that the thermal choke layer 316 is a passive thermal management structure, e.g., there is no circulation of heat transfer fluids within the cavities, with the potential exception of a heat transfer gas such as helium that may transit through some of the first cavities 318 en route, for example, to gas distribution holes in the top plate 304 and dielectric layer 302 that may allow such heat transfer gas to be introduced between the ESC and a wafer supported by the ESC during normal semiconductor processing operations, e.g., active semiconductor processing. For example, there is no circulation of a heat transfer fluid that is part of a recirculating heat exchange system within the cavities.

In some embodiments, the thermal choke layer 316 may be made of a material that includes a metal, and which may include aluminum or an aluminum alloy. The thermal choke layer 316 may also be made of a non-metallic material such as, for example, a ceramic. The thermal choke layer 316 may also be made of a material with low thermal conductivity.

The first cavities 318 may be of various shapes, sizes, and/or volumes, and may extend through the thermal choke layer 316 at different depths and/or angles. The angles of the first cavities 318 may be measured with respect to the ceramic layer 302, the first axis 312, or any other portion of the ESC. In some embodiments, there may be more than one thermal choke layer 316. In some implementations, the first cavities 318 may be cylindrically shaped and have a diameter of 0.5 centimeters or less. In some such implementations, the first cavities 318 may be spaced apart from each other by 2 millimeters or less. In some embodiments, the first cavities 318 may be or more than one shape, and may be spaced apart by different distances.

Figure 5:
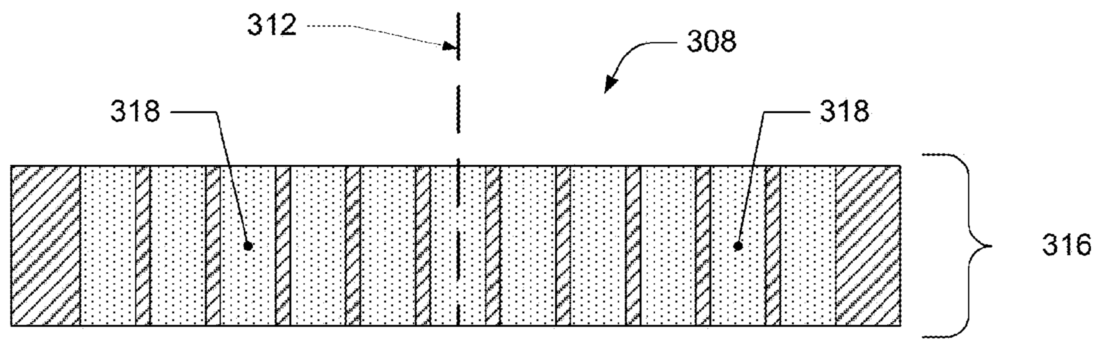
FIG. 5 depicts a section view of a thermal choke with an example configuration of a plurality of first cavities.
Figure 6:
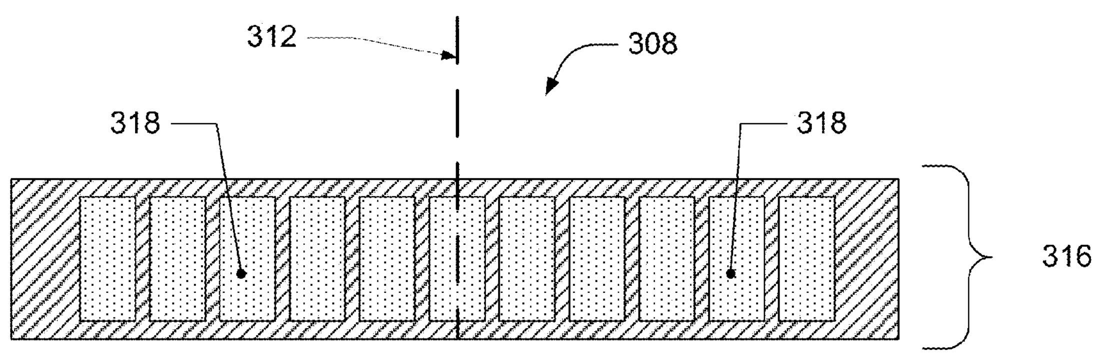
FIG. 6 depicts a section view of a thermal choke with a second example configuration of a plurality of first cavities.
Figure 7:
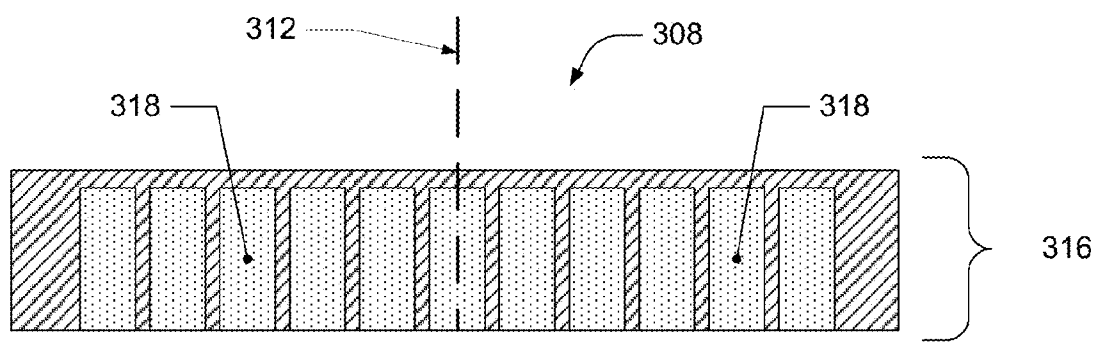
FIG. 7 depicts a section view of a thermal choke with a third example configuration of a plurality of first cavities.

The first cavities 318 may extend through and/or within the thermal choke layer 316 in various configurations. Some non-limiting example configurations of the first cavities 318 within the thermal choke layer 316 are depicted in FIGS. 5, 6, and 7. FIG. 5 depicts a section view of a thermal choke with an example configuration of a plurality of first cavities. As can be seen, the thermal choke 308 includes a plurality of first cavities 318 that extends entirely through the thermal choke layer 316. FIG. 6 depicts a section view of a thermal choke with a second example configuration of a plurality of first cavities. As shown, the thermal choke 308 in FIG. 6 includes a plurality of first cavities 318 that extends within the thermal choke layer 316, but not through an end surface of the thermal choke layer 316. FIG. 7 depicts a section view of a thermal choke with a third example configuration of a plurality of first cavities. In this Figure, the first cavities 318 extend through one end surface of the thermal choke layer 316, but do not extend through the opposite end surface. In all three examples of FIGS. 5 through 7, the first cavities 318 extend through the thermal choke layer in a direction substantially parallel to the first axis 312, e.g., within ±5° of the first axis 312.

The thermal choke 308 may be manufactured in any number of ways to create the first cavities 318 within the thermal choke layer 316, including, for example, traditional manufacturing techniques, such as casting, injection molding, or machining, or using more advanced techniques, such as 3D printing. In some embodiments, the thermal choke 308 may be created by assembling two or more parts together. For instance, the thermal choke layer 316 depicted in FIG. 6 may be constructed by creating a thermal choke layer 316 like in FIG. 5 and placing an additional, thinner layer on the top and the bottom of the thermal choke layer 316 in order to "cap" or seal the first cavities 318 such that one or more first cavity may be fluidically isolated from one or more of the other first cavities 318. It is also to be understood that the thermal choke layer 316 may also be a sub-portion of another part, e.g., the baseplate 310 may have a number of holes drilled in its upper surface to form the first cavities 318.

In some embodiments, as discussed earlier, one or more of the first cavities may not be fluidically isolated from one or more of the other ESC layers and/or processing chamber. For example, the ESC may be configured such that a heat transfer gas may flow through portions of the thermal choke, the heater, the top plate, and the ceramic layer.

Figure 8:
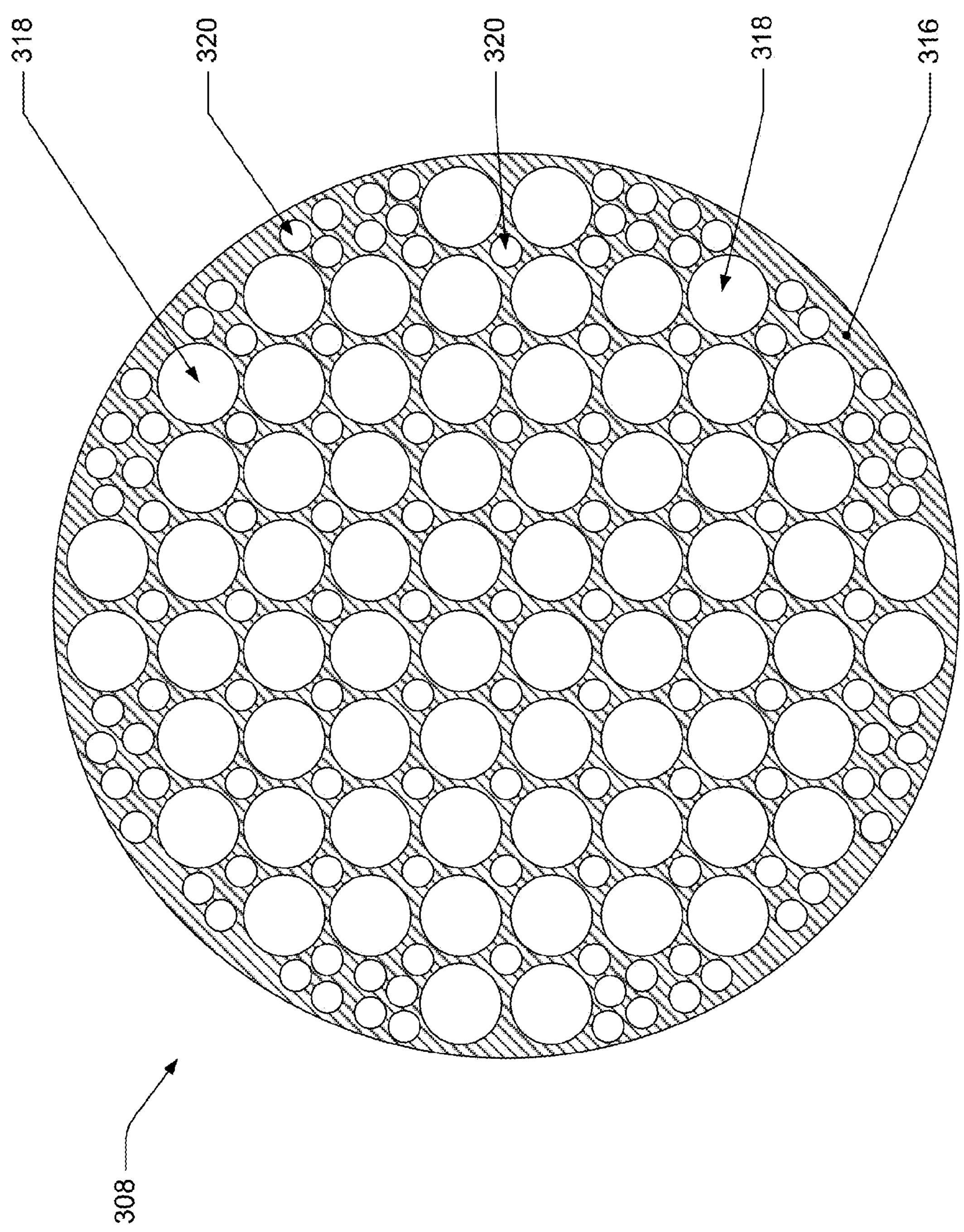
FIG. 8 depicts a top view of the thermal choke with a plurality of first cavities and a plurality of second cavities.

In some implementations, the thermal choke 308 may also include a plurality of second cavities 320 that are arranged across the thermal choke layer 316 and sized differently than the first cavities 318. FIG. 8 depicts a top view of the thermal choke with a plurality of first cavities and a plurality of second cavities. As can be seen, the second cavities 320 are sized smaller than the first cavities 318 and both pluralities of cavities are arranged across the thermal choke layer 316. The second cavities 320 may be of various sizes and shapes, for instance, circular or rectangular. The second cavities 320 may also be sized and/or shaped in order to fit into interstices between the first cavities 318 or in regions near the perimeter of the thermal choke layer 316 where it is not possible to fit a first cavity 318. The second cavities 320 may also be of different shape and size from each other. The second cavities may be spaced apart from each other and/or the first cavities by 2 mm or less. The second cavities 320 may also extend through the thermal choke layer 316 in a manner similar to that described hereinabove for the first cavities 318 and shown in the non-limiting examples of FIGS. 5 to 7.

The second cavities 320 may be configured similar to the first cavities 318. In some embodiments, the second cavities 320 may be filled with a gas and such gas may have low thermal conductivity. In some other embodiments, the second cavities 320 may be filled with a material with a low thermal conductivity, for instance, a ceramic material, Teflon, silicone, a polyimide, and/or Kapton, and in some embodiments, the material with a low thermal conductivity may have a lower thermal conductivity than the material of thermal choke layer 316. The second cavities 320 may be filled with gas and/or material in any number of combinations that suit the desired semiconductor process and/or thermal tuning of the ESC, as described above with the first cavities 318.

As can be seen from the above examples, the thermal choke layer 316 is interposed between the heater 306 and the baseplate 310, and is thus configured to primarily choke axial heat flow from the heater 306 to the baseplate 310 in a direction parallel to the first axis 312, as opposed to primarily choking radial heat flow from the heater 306 in directions perpendicular to the first axis 312.

Figure 9:
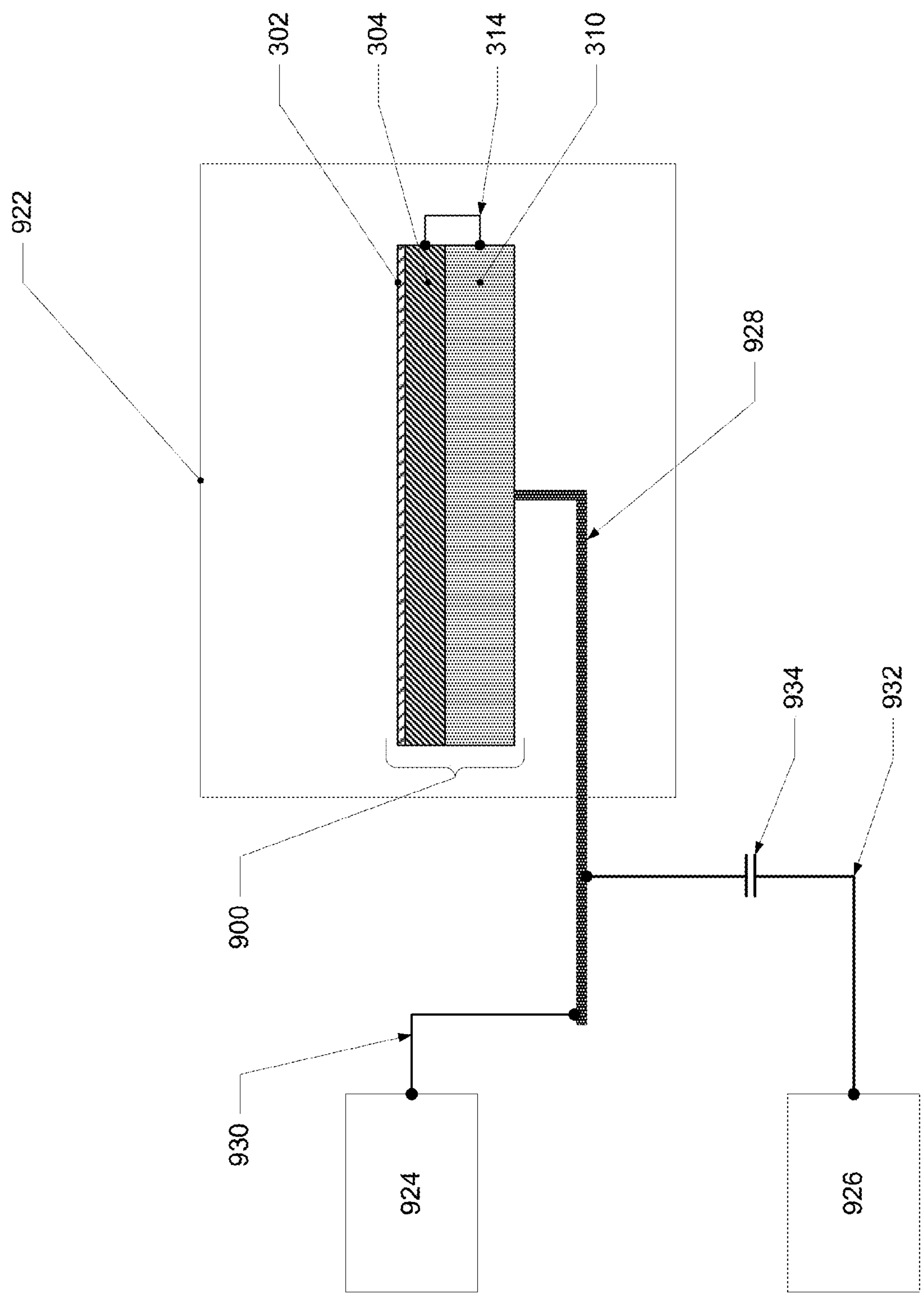
FIG. 9 depicts an example electrical configuration of an ESC.

Example embodiments of some electrical configurations of an ESC will now be discussed. As depicted in FIG. 3, ESC 300 is configured such that the top plate 304 and the baseplate 310 are electrically connected with each other. FIG. 9 depicts an example electrical configuration of an ESC. As can be seen, ESC 900 is shown and includes a ceramic layer 302, a top plate 304, and a baseplate 310; ESC 900 and/or its layers may be configured similarly to, and/or contain some or all of the same elements and features of, the ESC 300 discussed herein, but is shown in FIG. 9 with a limited number of layers for demonstration purposes. The ceramic layer 302 is disposed on the top plate 304, the top plate 304 is interposed between the ceramic layer 302 and the baseplate 310, and the top plate 304 and the baseplate 310 are electrically connected to each other, as represented by the electrical connection 314. ESC 900 is placed within a semiconductor processing chamber 922, while a DC supply 924 and an RF generator 926 are placed outside the processing chamber 922. The DC supply 924 is configured to provide a high-voltage, DC electrostatic clamping voltage, while the RF generator 926 is configured to provide high-voltage RF power.

Both the DC supply 924 and the RF generator 926 are electrically connected to the ESC 900 by a common, electrically conductive path 928 that extends from outside the processing chamber 922 to a location inside the processing chamber 922 and that is in electrically conductive contact with the baseplate 310 of the ESC 900. The DC supply 924 is electrically connected to the common, electrically conductive path 928 outside the processing chamber by a DC connector 930, while the RF generator 926 is connected to the common, electrically conductive path 928 outside the processing chamber by a RF connector 932. The DC connector 930 and the RF connector 932 may each connect to the common, electrically conductive path 928 at one or more locations outside the processing chamber 922. As shown in FIG. 9, DC connector 930 and the RF connector 932 may each connect to the common, electrically conductive path 928 at separate locations outside the processing chamber 922. The common, electrically conductive path 928 may electrically connect to the ESC at one or more locations, including, among others, the baseplate 310 as shown in FIG. 9. In some embodiments, the common, electrically conductive path may be the electrical path of the RF generator 926 to the ESC 900 in the processing chamber 922.

In some embodiments, a capacitor 934 may be electrically interposed between the RF generator 926 and the DC supply 924, and may not be electrically interposed between the DC supply 924 and the ESC 900, in order to prevent the DC voltage from entering the RF generator. In some embodiments, the capacitor 934 may be electrically placed along the RF connector 932, as depicted in FIG. 9. Some such embodiments may block a DC voltage from reaching and interfering with the RF generator 926 while allowing both RF energy and DC voltage to reach the ESC 900. The capacitance of the capacitor 934 may, for instance, be 21 nanofarads or less. In some embodiments, the capacitance of the capacitor 934 may be determined by the RF frequency and/or chamber impedance. In some other embodiments, more than one capacitor 934 may be electrically interposed between the RF generator 926 and the DC supply 924, and may not be electrically interposed between the DC supply 924 and the ESC 900. Additionally, one or more capacitors may be placed in parallel with the same and/or different capacitances.

It is to be understood that the top plate 304 and the baseplate 310 may be electrically connected through any number of methods. In some embodiments, the heater 306 and/or thermal choke 308 may be embedded in metal such that when the layers of the ESC 100, including but not limited to the baseplate 310, thermal choke 308, heater 306, and top plate 304, are brazed and/or bonded together, the baseplate 310 and top plate 304 may be inherently electrically connected. In some other similar embodiments, the heater 306 and the thermal choke 308 may be embedded within the baseplate 310, similar to FIG. 11 discussed below, which again may naturally electrically connect the baseplate 310 to the top plate 304 when these two layers are bonded and/or brazed to each other.

Figure 10:
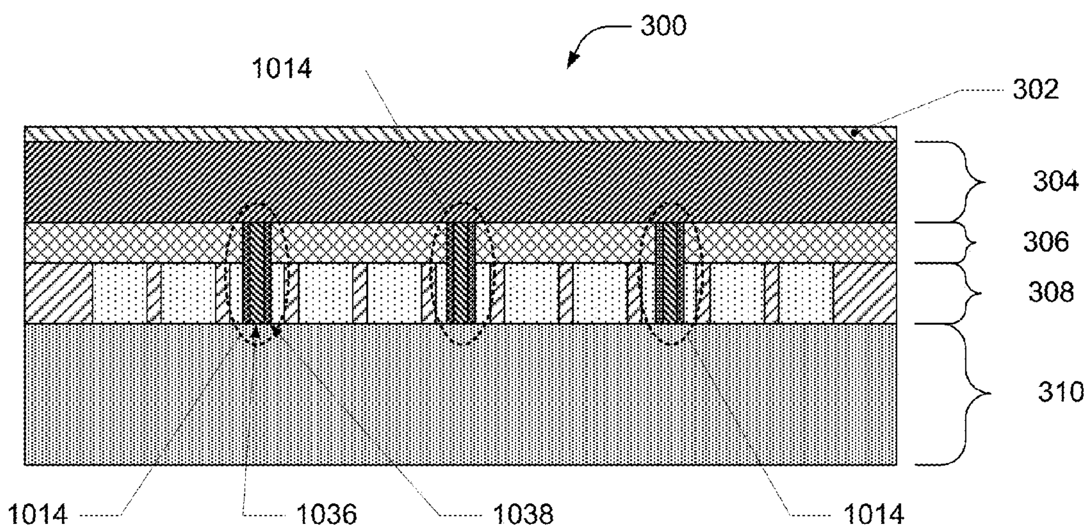
FIG. 10 depicts one example electrical connection between the top plate and baseplate of an ESC.

FIG. 10 depicts one example electrical connection between the top plate and baseplate of an ESC. As shown in FIG. 10, ESC 300, which may be configured as previously described, includes a ceramic layer 302, and top plate 304, a heater 306, a thermal choke 308, a baseplate 310, and electrical connections 1014 that are shown within the dashed ovals. In such an example embodiment, the top plate 304 is electrically connected to 310 using the electrical connections 1014 that extend internally within the ESC 300. In some embodiments, the electrical connections 1014 may include an electrically conductive pin 1036 that is contained within a sleeve 1038, in which the electrically conductive pin 1036 electrically connects the top plate 304 with the baseplate 310, and the sleeve 1038 electrically insulates the electrically conductive pin 1036 from other elements of the ESC 300, if necessary (in some implementations, the sleeve 1038 may not be needed). The ESC 300 may use one or more electrical connections 1014, including, but not limited to, three electrical connection 1014 as shown in FIG. 10. The electrical connections 1014 may also be routed through one or more layers of the ESC 300, and may extend through one or more first cavity 318 and/or one or more second cavity 320.

Figure 11:
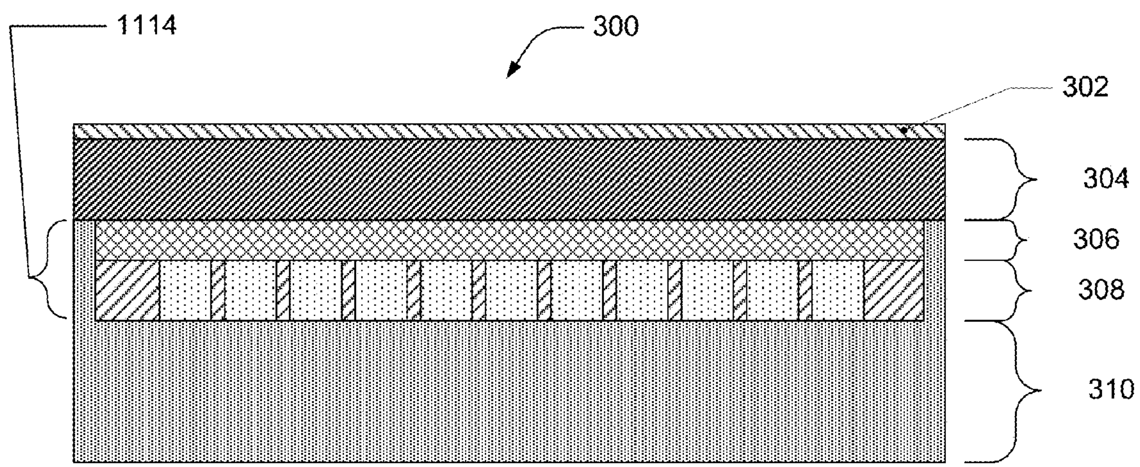
FIG. 11 depicts a second example electrical connection between the top plate and baseplate of an ESC.

FIG. 11 depicts a second example electrical connection between the top plate and baseplate of an ESC. As can be seen, FIG. 11 includes ESC 300, which may be configured as previously described, that includes a ceramic layer 302, and top plate 304, a heater 306, a thermal choke 308, a baseplate 310, and electrical connections 1014. In this depicted embodiment, the electrical connection 1114 may be a member of the baseplate 310 itself. In some such embodiments, the baseplate 310 may be manufactured or configured such that it may include one or more members that are electrically connected with the top plate 304. As depicted in FIG. 11, one or more members of the baseplate 310, e.g., a circumferential exterior wall, extend towards the top plate 304 along the outer edge of the ESC 300. The one or more members of the baseplate 310 that are electrically connected with the top plate 304 may extend through and/or along one or more layers of the ESC 300 and/or one or more areas within the ESC 300. For example, the thermal choke 308 and the heater 306 may be encircled, as shown, by the one or more members, and capped by the top plate 304. In some implementations, the one or more members may alternatively or additionally extend from the top plate 304 and extend towards the baseplate 310.

In some embodiments in which the ESC 300 includes a thermal choke 308, the thermal choke layer 316 may be made of a metal and the thermal choke 308 may be electrically connected to the baseplate 310 and the top plate 304; in such implementations, the thermal choke 308 may act as the electrical connection 1014. The electrical connections between such elements may be made through any number of methods known to a person of ordinary skill in the art, including those discussed herein.

Figure 12:
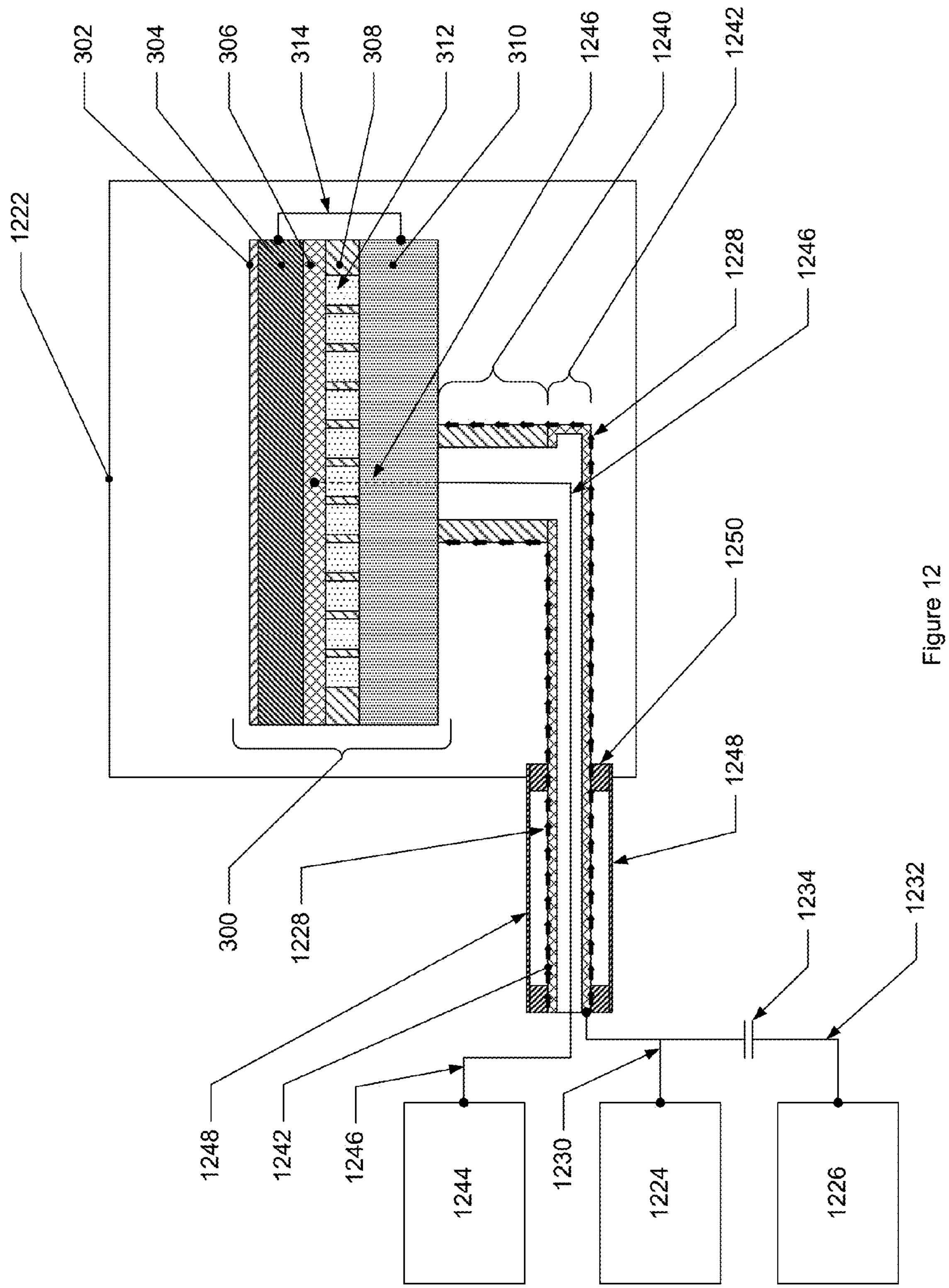
FIG. 12 depicts a sectional view of a semiconductor processing chamber with an ESC, support column, and transverse support arm.

The ESC 300 may also be configured within a semiconductor processing chamber on a support column and transverse support arm, both of which may be used to route hoses, wires, cables, tubes, or other conduits, electrical current, and/or RF energy from outside the processing chamber to the inside the processing chamber. FIG. 12 depicts a sectional view of a semiconductor processing chamber with an ESC, support column, and transverse support arm. As can be seen, ESC 300 is placed within semiconductor processing chamber 1222 and includes a ceramic layer 302, and top plate 304, a heater 306, a thermal choke 308, a baseplate 310, and an electrical connection 314. ESC 300 may be configured as previously described.

FIG. 12 also depicts the ESC 300 connected to a support column 1240 that is connected to a transverse support arm 1242. In some embodiments, the transverse support arm 1242 may span, or extend, from an area outside the processing chamber 1222 to an area inside the processing chamber 1222, as shown in FIG. 12. The support column 1240 may be oriented parallel to the first axis 312, but may be at other orientations in other implementations. Likewise, the transverse support arm 1242 is depicted as perpendicular to the support column 1240 and parallel to the layers of the ESC 300, however it may be at other orientations in other implementations.

The support column 1240 and the transverse support arm 1242 may also be constructed into various and/or different shapes, sizes, and cross-sections, including, for instance, cylindrical. In some embodiments, the support column 1240 and the transverse support arm 1242 may be hollow, as shown in FIG. 12. In some such embodiments, the support column 1240 and the transverse support arm 1242 may have the same or different cross-sectional shapes and/or areas. In some embodiments, one or both of the support column 1240 and the transverse support arm 1242 may be solid. In some embodiments, a portion of one or both of the support column 1240 and the transverse support arm 1242 may be hollow while one or more other portions may be solid.

In some embodiments, the support column 1240 and the transverse support arm 1242 may be electrically connected to each other. As shown in FIG. 12, the common, electrically conductive path 1228, illustrated by black arrows, travels from outside the processing chamber 1222 to the ESC 300 inside the processing chamber 1222 along the transverse support arm 1242 and the support column 1240. In some such embodiments, the transverse support arm 1242 and the support column 1240 may be made, at least in part, of electrically conductive material which may be metal, and support column 1240 may be electrically connected with the ESC 300. In some embodiments, the transverse support arm 1242 and the support column 1240 may serve as at least part of the common, electrically conductive path 1228. In some other embodiments, the common, electrically conductive path 1228 may be a wire or other electrical material that may run along and/or through the transverse support arm 1242 and/or the support column 1240.

The electrical configurations of ESC 300 in FIG. 12 may be the same as those previously discussed. FIG. 12 depicts the DC supply 1224 and the RF generator 1226 electrically connected to the common, electrically conductive path 1228. As shown, DC supply 1224 is electrically connected by the DC connector 1230 to the transverse support arm 1242, and likewise, RF generator 1226 is electrically connected by the RF connector 1232 to the transverse support arm 1242; the transverse support arm 1242 serves as part of the common, electrically conductive path 1228. Capacitor 1234 is also electrically interposed between the RF generator 1226 and the DC supply 1224, and may not be electrically interposed between the DC supply 1224 and the ESC 300.

The heater 306 may have a heater power source 1244 that may be located outside the processing chamber 1222. The heater power source 1244 may have a heater power wire 1246 that extends from outside the processing chamber 1222 to the heater 306 in the ESC 300 and inside the processing chamber 1222. In some embodiments, the heater power cable 1246 may be routed along and/or through the transverse support arm 1242 and the support column 1240, and may be routed through the ESC 300 to the heater 306. As depicted in FIG. 12, the transverse support arm 1242 and the support column 1240 are hollow which allows the heater power wire 1246 to travel through the transverse support arm 1242 and the support column 1240.

As shown in FIG. 12, some embodiments may include an insulation shield 1248 which electrically insulates the transverse support arm 1242 from the housing of the processing chamber 1222 such that any electrical current, e.g., DC voltage, conducted by the transverse support arm 1242 is not conducted to the processing chamber 1222, which may include the housing of the processing chamber 1222. The insulation shield 1248 may include one or more insulators 1250 which electrically insulate the transverse support arm 1242 from the outer wall of the insulation shield 1248 so that no electrical current is conducted from the transverse support arm 1242 to the outer wall of the insulation shield 1248. The insulator 1250 may be concentric in shape and may be made of non-conductive material. The insulation shield 1248 may also electrically insulate at least a portion of the transverse support arm 1242 that is located outside the processing chamber 1222 such that a user or equipment that contacts the transverse support arm 1242 is not exposed to the electrical current conducted by the transverse support arm 1242. The insulation shield 1248 may also extend further into the processing chamber 1222 which may insulate the transverse support arm 1242 further inside the processing chamber, and may include at least a portion of the support column 1240.

In some embodiments, the ESC 300 may be supported within a semiconductor processing chamber 1222 on a support column 1240. In some such embodiments, there may not be a transverse support arm 1242 and the support column 1240 may simply extend vertically from the ESC 300 through the "bottom" of the processing chamber 1222. The support column 1240 may be configured similar to the above descriptions such that, for instance, the RF generator 1226 and the DC supply 1224 may be electrically connected to the support column 1240 outside the processing chamber 1222 which may cause the support column 1240 to act as the common, electrically conductive path 1228 to the ESC 300. The support column 1240 may also be hollow, as discussed above, and some wires, cables, hoses, tubes, and/or conduit may travel through the support column to the ESC 300 and/or the inside of the processing chamber 1222. Some such embodiments may also include an insulation shield 1248 and insulators 1250, as discussed above, which may electrically insulate the support column 1240 from the housing of the processing chamber 1222, as well as at least a portion of support column 1246 outside the processing chamber 1222 and/or a portion of the support column 1240 within the processing chamber.

The electrical embodiments and configurations herein described may enable one or more layers of the ESC 900, including at least the top plate 304 and the baseplate 310, to act as both a clamping electrode for holding a wafer in place on the ceramic layer 302 and as an RF electrode for generating plasma. These embodiments may have many beneficial results, including those described above. As discussed, such embodiments allow for the removal of the clamping electrodes from the ceramic layer 902, which in turn allows the ceramic layer 902 to be much, much thinner than might otherwise be used, which permits the larger operating range on the "left side" of the Paschen curve. These embodiments also allow for the manufacture of a dielectric layer that contains embedded clamping electrodes and their necessary electrical connections to be eliminated.

These electrical embodiments may also increase the area of the clamping electrode to the surface area of the ESC, including that of the top plate 304 and/or the baseplate 310, such that the resulting clamping electrode encompasses all of the wafer's surface area, thereby providing, among other things, better clamping of the wafer. Moreover, the embodiments discussed herein provide a more robust design than some current ESCs and result in higher reliability. As discussed above, a further benefit of such electrical configurations includes increased uniformity and chamber to chamber matching because of the potential elimination of at least one cables within the processing chamber 1222.

The ceramic layer 302 may have a thickness less than 100 microns, and may be equal to or less than 1.5 mil, in some implementations. The ceramic layer 302 may be a coating that is applied to the top plate 304. The ceramic layer 302 may also be a thin ceramic sheet that may be laminated onto the top plate 304. The ceramic layer 302 may also be metalized on one side which may then be brazed to the top plate 304. The ceramic layer 302 may also be fabricated onto the top and/or sides of the ESC with a dry method, such as chemical vapor deposition ("CVD").

By using a thinner ceramic layer than current ESCs, epoxy that may be traditionally used to connect the ceramic layer to the ESC, which causes a high loss tangent, may not be needed due to the thin ceramic layer's ability to be metalized and brazed to the ESC. In some previous ESCs, the epoxy was traditionally used because brazing could damage the Kapton insulation that is used to electrically insulate many types of heaters.

One or more of the layers of the ESCs discussed hereinabove, including but not limited to, the top plate 304, the heater 306, the thermal choke 308, and/or the baseplate 310, may be connected to another layer by brazing, welding, epoxy, or other connection method. In some configurations, one or more of these layers may be made of a material different than one of the other layers. Furthermore, in some embodiments, one or more of these layers may be embedded or placed within another layer. For instance, the heater 306 and the thermal choke 308 may be embedded within the baseplate 310, as shown in FIG. 11.

Figure 13:
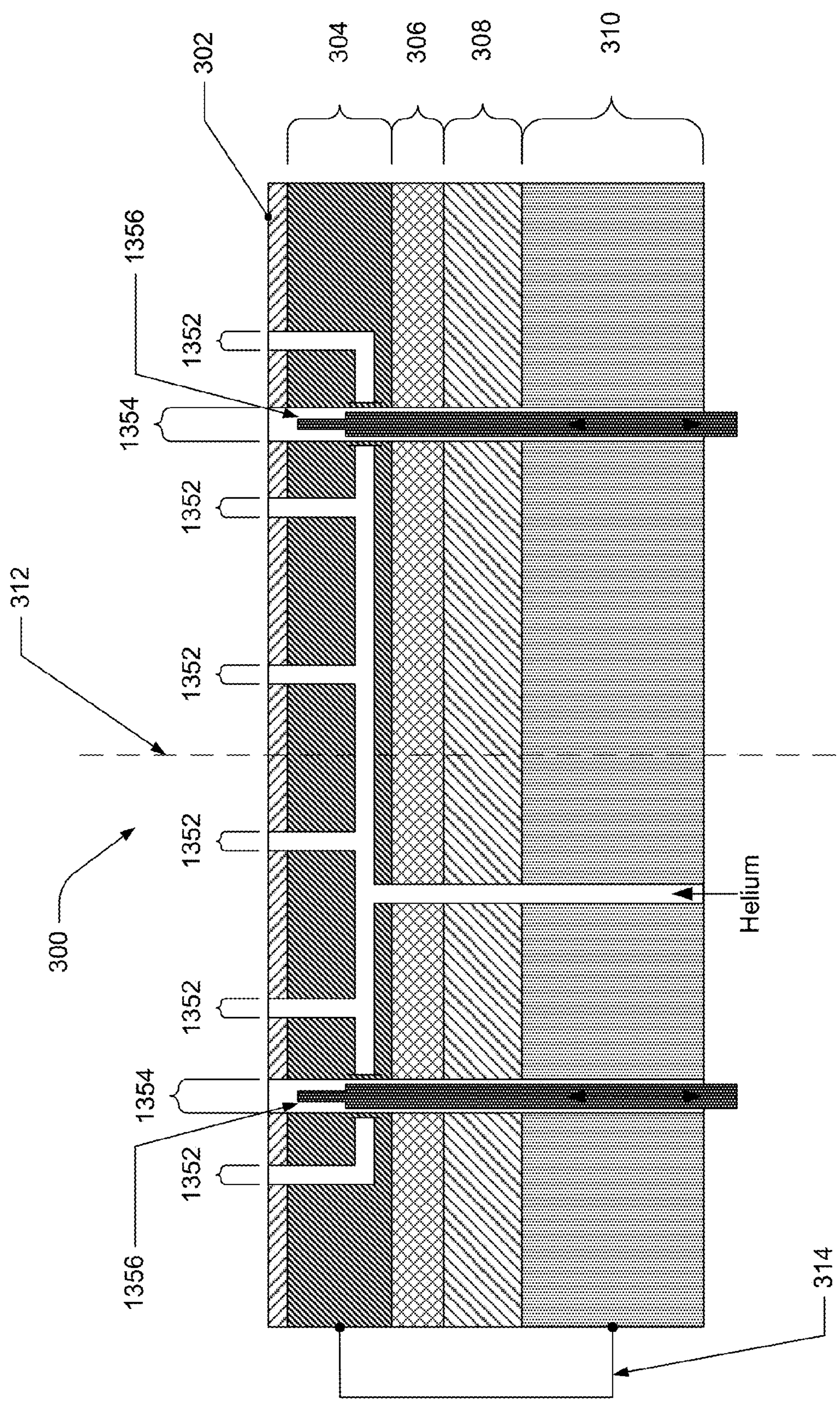
FIG. 13 depicts a cross section of ESC 300 that includes gas distribution holes and lift pin holes.

In some embodiments, although not included in the Figures herein, the ESC may include features that may be used for semiconductor processing, including but not limited to gas distribution holes through which gas may flow through part or all of the ESC, lift pins to lift the substrate, water hoses, and/or cooling channels. For instance, the ESC 300 previously discussed may include gas distribution holes and lift pin holes containing lift pins. FIG. 13 depicts a cross section of ESC 300 that includes gas distribution holes and lift pin holes. As can be seen, ESC 300 includes the layers previously discussed, including the ceramic layer 302, the top plate 304, the heater 306, the thermal choke 308, the baseplate 310, the electrical connection 314 between the baseplate 310 and the top plate 304, the first axis 312, as well as gas distribution holes 1352 and lift pin holes 1354 that include lift pins 1356. The gas distribution holes 1352 in FIG. 13 may extend, for example, to a common manifold or distribution passage within the top plate 304, which may, in turn, be connected with a passage that extends through all of the layers of the ESC 300 and which may be connected with a heat transfer gas supply, such as a helium supply. The lift pin holes 1354 may contain lift pins 1356 that may be configured to be recessed below the top surface of the ceramic layer and to be extendable past the ceramic layer 302 such that the lift pins 1356 may contact a wafer on and/or above the ceramic layer 302 and lift the wafer clear of the ceramic layer 302. The ESC may also include other features that may be used to install the ESC and/or make the ESC functional for one or more semiconductor manufacturing processes, including features for mounting the ESC inside the processing chamber, electrical connections to the RF generator/DC power supply, and/or helium gas supply. It should be noted that the inventors contemplate the ESCs discussed within this disclosure may be used for any type of semiconductor processing, including, but not limited to, atomic layer deposition, atomic layer etching, chemical vapor deposition, plasma-enhanced chemical vapor deposition, and so forth.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the above implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description above because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

What is claimed is:

1. An electrostatic chuck comprising:

a baseplate;

a thermal choke having a thermal choke layer including:

a plurality of first cavities arranged across the thermal choke layer, wherein the first cavities do not contain liquid during normal operation of the electrostatic chuck and are selected from the group consisting of: cavities filled with gas and cavities filled with solid material having a lower thermal conductivity than a material of the thermal choke layer, and a plurality of second cavities arranged across the thermal choke layer, wherein the second cavities do not contain liquid during normal operation of the electrostatic chuck, are selected from the group consisting of cavities filled with gas and cavities filled with solid material having a lower thermal conductivity than a material of the thermal choke layer, are each sized the same as the other second cavities, are differently sized than the first cavities, and do not intersect with the first cavities;

a heater;

a top plate; and a ceramic layer, wherein:

the baseplate is adjacent to the thermal choke, the thermal choke is interposed between the baseplate and the heater, the heater is interposed between the thermal choke and the top plate, the top plate is interposed between the heater and the ceramic layer, the ceramic layer is adjacent to the top plate, the top plate and the baseplate are both made of metal, and the top plate and the baseplate are in electrically conductive contact with each other.

2. The electrostatic chuck of claim 1, wherein the first cavities extend through the thermal choke layer in a direction substantially parallel to an axis perpendicular to the ceramic layer.

3. The electrostatic chuck of claim 1, wherein the first cavities are spread across substantially the whole thermal choke layer.

4. The electrostatic chuck of claim 1, wherein the material of the thermal choke layer is metal.

5. The electrostatic chuck of claim 1, wherein the material of the thermal choke layer is aluminum.

6. The electrostatic chuck of claim 1, wherein the first cavities are spaced apart from each other by 2 millimeters or less.

7. The electrostatic chuck of claim 1, wherein one or more of the first cavities have a diameter of 0.5 centimeters or less.

8. The electrostatic chuck of claim 1, wherein the first cavities are filled with solid material selected from the group consisting of: a ceramic material, Teflon, a silicone, and a polyimide.

9. A system comprising:

a semiconductor processing chamber;

an electrostatic chuck located inside the semiconductor processing chamber, the electrostatic chuck including:

a baseplate, a top plate, and a ceramic layer;

a common, electrically conductive path that extends from outside the semiconductor processing chamber to a location in electrically conductive contact with the electrostatic chuck and inside the semiconductor processing chamber;

a high-voltage direct current (DC) supply configured to provide an electrostatic clamping voltage;

a high-voltage radio frequency (RF) generator configured to provide RF energy; and a transverse support arm that supports the electrostatic chuck, wherein:

the top plate is interposed between the baseplate and the ceramic layer, the ceramic layer is adjacent to the top plate, the top plate and the baseplate are both made of metal, the top plate and the baseplate are in electrically conductive contact with each other, the transverse support arm spans between a location inside the semiconductor processing chamber and a location outside the semiconductor processing chamber, at least a portion of the transverse support arm that spans between the inside and the outside the semiconductor processing chamber serves as a part of the common, electrically conductive path, the transverse support arm is electrically insulated from the walls of the semiconductor processing chamber, and the high-voltage DC supply and the high-voltage RF generator are both electrically connected to the common, electrically conductive path at one or more locations on the portion of the transverse support arm that is located outside of the semiconductor processing chamber.

10. The system of claim 9, further comprising a capacitor located outside of the semiconductor processing chamber, wherein:

the capacitor is electrically interposed between the high-voltage RF generator and the high-voltage DC supply, and the capacitor is not electrically interposed between the high-voltage DC supply and the electrostatic chuck.

11. The system of claim 10, wherein the capacitor has a capacitance of 21 nanofarads or less.

12. The system of claim 9, further comprising a support column, wherein:

the support column supports the electrostatic chuck and is interposed between the baseplate and the transverse support arm, the support column is made of metal, the support column and the transverse support column are electrically connected, and the support column serves as a part of the common, electrically conductive path.

13. The system of claim 9, the electrostatic chuck further including:

a thermal choke having a thermal choke layer including a plurality of first cavities arranged across the thermal choke layer, wherein the first cavities do not contain liquid during normal operation of the electrostatic chuck and are selected from the group consisting of cavities filled with gas and cavities filled with solid material having a lower thermal conductivity than a material of the thermal choke layer; and a heater, wherein:

the baseplate is adjacent to the thermal choke, the thermal choke is interposed between the baseplate and the heater, and the heater is interposed between the thermal choke and the top plate.

14. The system of claim 13, wherein:

a portion of the thermal choke layer is metal, and the thermal choke is electrically connected to both the baseplate and the top plate via the portion.

15. The system of claim 12, further comprising:

a heater power cable, wherein:

the transverse support arm is hollow, and the heater power cable is routed from a location external to the semiconductor processing chamber to the heater through the transverse support arm.

16. The system of claim 9, wherein:

the ceramic layer has a thickness less than 100 microns.

17. The system of claim 16, wherein the ceramic layer has a thickness of 3 mil or less.

18. The system of claim 16, wherein the ceramic layer is selected from the group consisting of: a ceramic coating and a ceramic sheet laminated onto the top plate.

* * * * *